US012800677B2

(12) United States Patent
Narita

(10) Patent No.: US 12,800,677 B2
(45) Date of Patent: Nov. 17, 2026

(54) SENSOR AMPLIFIER CIRCUIT, SENSOR SYSTEM, AND METHOD OF CALIBRATING SENSOR AMPLIFIER CIRCUIT

(71) Applicant: Murata Manufacturing Co., Ltd., Nagaokakyo (JP)

(72) Inventor: Tetsuya Narita, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 106 days.

(21) Appl. No.: 19/077,396

(22) Filed: Mar. 12, 2025

(65) Prior Publication Data

US 2025/0208234 A1 Jun. 26, 2025

Related U.S. Application Data

(63) Continuation of application No. PCT/JP2023/034667, filed on Sep. 25, 2023.

(30) Foreign Application Priority Data

Sep. 30, 2022 (JP) ................................ 2022-158183

(51) Int. Cl.
*G01R 33/00* (2006.01)
*G01R 33/09* (2006.01)

(52) U.S. Cl.
CPC ....... *G01R 33/0023* (2013.01); *G01R 33/098* (2013.01)

(58) Field of Classification Search
CPC .......................... G01R 33/0023; G01R 33/098
See application file for complete search history.

(56) References Cited

U.S. PATENT DOCUMENTS 8,392,140 B1 * 3/2013 Bartholet ........... G01R 33/0023 702/94
9,625,496 B2 4/2017 Futakuchi et al.
10,224,909 B1 3/2019 Tsai et al.
(Continued)

FOREIGN PATENT DOCUMENTS

CN 102778584 A 11/2012
JP H02-285212 A 11/1990
(Continued)

OTHER PUBLICATIONS

International Search Report received for PCT Patent Application No. PCT/JP2023/034667, mailed on Dec. 12, 2023, 2 pages (English Translation only).

*Primary Examiner* — Paresh Patel
(74) *Attorney, Agent, or Firm* — ArentFox Schiff LLP

(57) ABSTRACT

A sensor amplifier circuit that amplifies an output signal from a magnetic sensor circuit. The sensor amplifier circuit includes a first operational amplifier that amplifies an output signal from the magnetic sensor circuit, and a correction circuit that corrects a nonlinear distortion contained in the output signal. The magnetic sensor circuit outputs a first signal with a magnitude corresponding to the magnetic field in the first range and outputs a second signal with a magnitude corresponding to the magnetic field in the second range. The correction circuit switches from a first state in which a nonlinear distortion contained in the output signal is not corrected to a second state in which a nonlinear distortion contained in the output signal is corrected.

20 Claims, 10 Drawing Sheets

(56) References Cited

U.S. PATENT DOCUMENTS

| | | | | |
|---|---|---|---|---|
| 10,976,383 | B2 | 4/2021 | Watanabe et al. | |
| 11,768,256 | B2 * | 9/2023 | Latham | G01D 5/14 324/244 |
| 2015/0316637 | A1 * | 11/2015 | Futakuchi | G01R 15/205 702/104 |
| 2019/0058462 | A1 | 2/2019 | Tsai et al. | |
| 2020/0116801 | A1 | 4/2020 | Watanabe et al. | |
| 2020/0150194 | A1 | 5/2020 | Raghavan et al. | |
| 2024/0003991 | A1 * | 1/2024 | Yajima | G01R 15/207 |

FOREIGN PATENT DOCUMENTS

| | | | |
|---|---|---|---|
| JP | 2015-212634 | A | 11/2015 |
| JP | 2018-115928 | A | 7/2018 |
| JP | 2019-036938 | A | 3/2019 |
| JP | 2020-060457 | A | 4/2020 |
| WO | 2022/209797 | A1 | 10/2022 |

* cited by examiner

SENSOR AMPLIFIER CIRCUIT, SENSOR SYSTEM, AND METHOD OF CALIBRATING SENSOR AMPLIFIER CIRCUIT

CROSS REFERENCE TO RELATED APPLICATIONS

This application is a continuation of International Application No. PCT/JP2023/034667, filed Sep. 25, 2023, which claims priority to Japanese Patent Application No. 2022-158183, filed Sep. 30, 2022, the contents of each of which are hereby incorporated by reference in their entirety.

TECHNICAL FIELD

The present disclosure relates to a sensor amplifier circuit and, more specifically, to a sensor amplifier circuit that amplifies an output signal of a magnetic sensor circuit, a sensor system, and a method of calibrating the sensor amplifier circuit.

BACKGROUND

In general, a magnetic element forming a magnetic sensor circuit has hysteresis and nonlinear characteristics. For this reason, a function for correcting an output signal of the magnetic sensor circuit to improve its linearity is needed for a sensor amplifier circuit that amplifies an output signal of the magnetic sensor circuit.

In this regard, Japanese Unexamined Patent Application Publication No. 2015-212634 (hereinafter "Patent Document 1") discloses a magnetic sensor that is configured to compute a magnetic flux density from an output voltage of a magnetic detection element, and compute and output a voltage having a linear relationship to the computed magnetic flux density.

Moreover, Japanese Unexamined Patent Application Publication No. 2018-115928 (hereinafter "Patent Document 2") discloses a signal correction method for a current sensor including a step of correcting a newly acquired differential output voltage by using a plurality of calculated fitting coefficients so that the differential output voltage is approximately linear with respect to a measured magnetic field and acquiring a corrected output voltage.

For some magnitudes of magnetic fields that are input to the magnetic sensor circuit, a nonlinear distortion generated in an output of the magnetic sensor circuit may be small. In such a case, the sensor amplifier circuit does not necessarily have to perform a process for correcting a nonlinear distortion. However, an existing sensor amplifier circuit has performed a process of correcting a nonlinear distortion on an output signal of the magnetic sensor circuit at all times regardless of whether a nonlinear distortion actually needs to be corrected. Consequently, there can be an unnecessary delay in the speed of response of the sensor amplifier circuit.

SUMMARY OF THE INVENTION

In view of the foregoing, a sensor amplifier circuit is provided that is configured to amplify an output of a magnetic sensor circuit with improved linearity to ensure high responsiveness.

In an exemplary embodiment, a sensor amplifier circuit is provided that amplifies an output signal from a magnetic sensor circuit. The sensor amplifier circuit includes a first operational amplifier that amplifies an output signal from the magnetic sensor circuit; and a correction circuit that corrects a nonlinear distortion contained in the output signal. The magnetic sensor circuit is configured to output, in a first magnetic field region to which a magnetic field in a first range has been applied, a first signal with a magnitude corresponding to the magnetic field in the first range and to output, in a second magnetic field region to which a magnetic field in a second range larger than the magnetic field in the first range has been applied, a second signal with a magnitude corresponding to the magnetic field in the second range. The correction circuit is configured to switch from a first state in which a nonlinear distortion contained in the output signal is not corrected to a second state in which a nonlinear distortion contained in the output signal is corrected. The correction circuit is configured to switch from the first state to the second state when an output signal from the magnetic sensor circuit changes from the first signal to the second signal.

The sensor amplifier circuit according to the exemplary embodiment of the present disclosure improves linearity while ensuring high responsiveness.

DETAILED DESCRIPTION OF EMBODIMENTS

Figure 1:
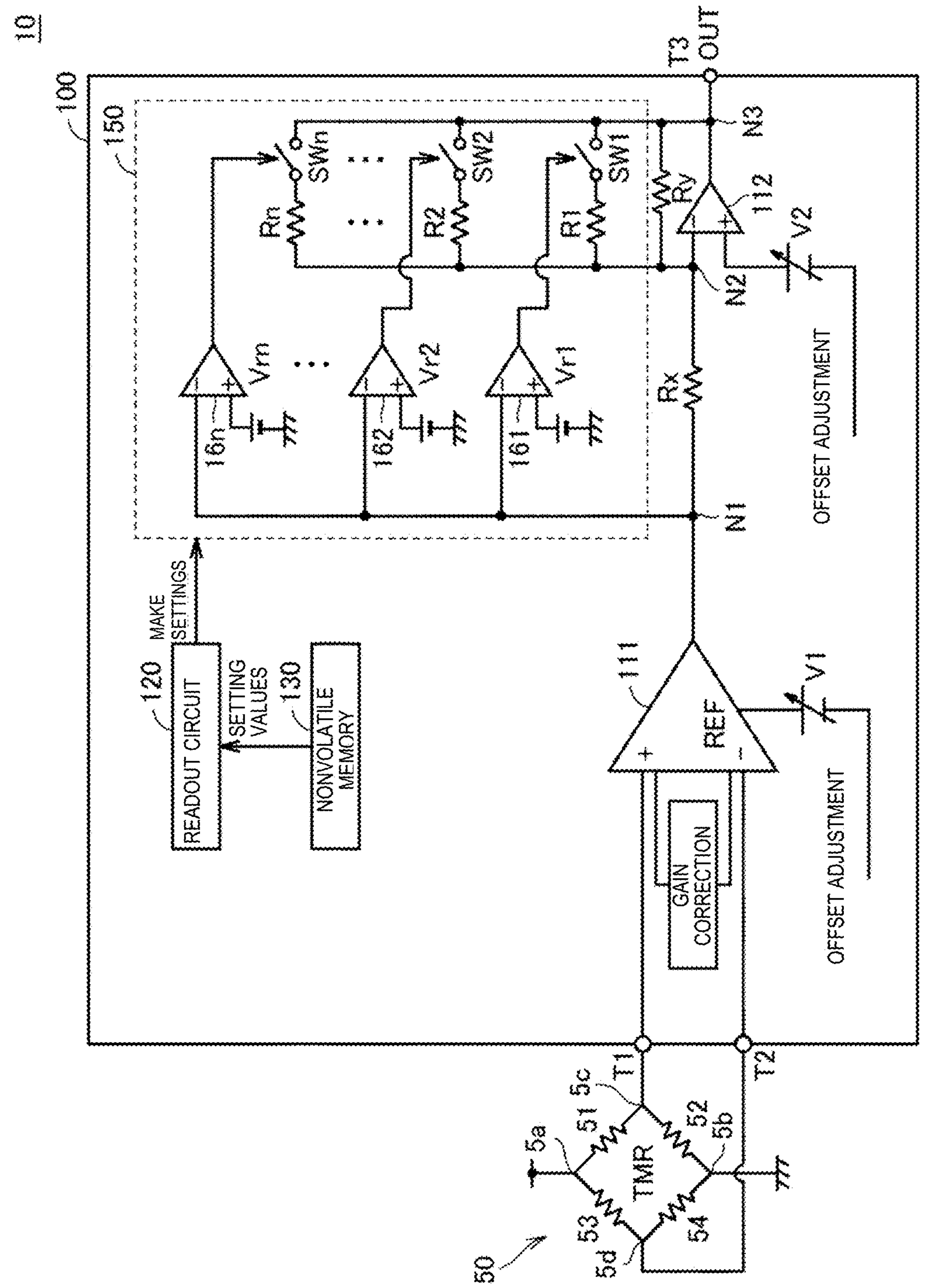
FIG. 1 is a schematic configuration diagram of a sensor system using a sensor amplifier circuit according to an exemplary embodiment.

An exemplary embodiment of the present disclosure will be described in detail below with reference to the drawings. It is noted that identical or corresponding elements or portions in the drawings are denoted by the same reference signs and a repeated description thereof is not given.

(Overview of Sensor System)

FIG. 1 is a schematic configuration diagram of a sensor system 10 using a sensor amplifier circuit 100 according to an exemplary embodiment. Referring to FIG. 1, the sensor system 10 includes a magnetic sensor circuit 50 and the sensor amplifier circuit 100.

As shown, the magnetic sensor circuit 50 includes four sensor elements 51 to 54 connected in a bridge configuration. In an example in FIG. 1, each of the sensor elements 51 to 54 can be a Tunneling Magneto-Resistive (TMR) element and is a magnetic sensor whose resistance value changes according to a detected magnetic field. TMR elements are used as the sensor elements 51 to 54, and thus the sensor system 10 having a high-sensitivity and high-accuracy sensing function can be provided.

Incidentally, other resistance elements may be used as the sensor elements 51 to 54 as long as resistance values thereof change according to a detected physical quantity. For example, Giant Magneto Resistance (GMR) elements, Anisotropic Magneto Resistance (AMR) elements, or other elements may be employed in place of TMR elements.

The sensor elements 51 and 52 are connected in series between a pair of power supply terminals 5*a* and 5*b*. Also, the sensor elements 53 and 54 are connected in series between the pair of power supply terminals 5*a* and 5*b*. The magnetic sensor circuit 50 is configured to operate when a predetermined voltage is applied to the power supply terminals 5*a* and 5*b*, and a voltage difference is generated between a pair of signal output terminals 5*c* and 5*d* in accordance with a detected magnetic field. The signal output terminal 5*c* is a connection node between the sensor element 51 and the sensor element 52, and the signal output terminal 5*d* is a connection node between the sensor element 53 and the sensor element 54.

The signal output terminals 5*c* and 5*d* are respectively connected to input terminals T1 and T2 of the sensor amplifier circuit 100. That is, a differential voltage between a pair of output signals of the magnetic sensor circuit 50 is provided as an input of the sensor amplifier circuit 100.

The sensor amplifier circuit 100 includes, in addition to the input terminals T1 and T2, an output terminal T3, operational amplifiers 111 and 112, a correction circuit 150, a readout circuit 120, and nonvolatile memory 130. The readout circuit 120 is, for example, an analog circuit. The nonvolatile memory 130 is, for example, Read Only Memory (ROM) or flash memory.

In addition, a non-inverting input terminal and an inverting input terminal of the operational amplifier 111 are respectively connected to the input terminals T1 and T2. A pair of output signals from the magnetic sensor circuit 50 are input to the non-inverting input terminal and the inverting input terminal of the operational amplifier 111. A voltage V1 for offset adjustment is applied to the operational amplifier 111. An output terminal of the operational amplifier 111 is connected to an inverting input terminal of the operational amplifier 112. A voltage V2 for offset adjustment is applied to a non-inverting input terminal of the operational amplifier 112. An output terminal of the operational amplifier 112 is connected to the output terminal T3 of the sensor amplifier circuit 100. Moreover, a resistor Ry for determining a reference amplification factor of the operational amplifier 112 is connected between the inverting input terminal and the output terminal of the operational amplifier 112.

The output terminal of the operational amplifier 111 is connected to a node N1. The inverting input terminal of the operational amplifier 112 is connected to a node N2. A resistor Rx is connected between the node N1 and the node N2.

In the exemplary aspect, the correction circuit 150 includes comparators 161 to 16*n*, resistors R1 to Rn, and switches SW1 to SWn.

Inverting input terminals of the comparators 161 to 16*n* are connected to the output terminal of the operational amplifier 111 at the node N1. Reference voltages Vr1 to Vrn are respectively applied to non-inverting input terminals of the comparators 161 to 16*n*. The switches SW1 to SWn are respectively switched ON and OFF in accordance with ON and OFF states of outputs of the comparators 161 to 16*n*.

Each of the switches SW1 to SWn is disposed between the node N2 and the node N3. The resistors R1 to Rn are respectively connected between the switches SW1 to Swn and the node N2.

In operation, the operational amplifier 111 is configured to amplify an output signal from the magnetic sensor circuit 50 by using a predetermined gain (e.g., an amplification factor). The operational amplifier 111 is configured to make an offset adjustment to the output signal from the magnetic sensor circuit 50 by using an offset setting value determined in accordance with the voltage V1. An output signal from the operational amplifier 111 is output from the output terminal T3 via the operational amplifier 112.

The sensor amplifier circuit 100 is configured to correct a nonlinear distortion in a signal by using the correction circuit 150. This nonlinear distortion is caused by output characteristics of the magnetic sensor circuit 50. An output signal from the operational amplifier 111 is affected by a nonlinear distortion caused by the output characteristics of the magnetic sensor circuit 50 and thus has a nonlinear distortion. The correction circuit 150 corrects such a nonlinear distortion. Hereinafter, correction of a nonlinear distortion is also referred to as "linearity correction" for purposes of this disclosure. The correction circuit 150 switches, in accordance with the magnitude of the output signal from the operational amplifier 111, between a first state in which no linearity correction is performed and a second state in which linearity correction is performed.

As for values of the reference voltages Vr1 to Vrn used in the correction circuit 150, a relationship of Vr1<Vr2< . . . <Vrn holds. The nonvolatile memory 130 stores values of the reference voltages Vr1 to Vrn for the respective corresponding comparators 161 to 16*n*. The values of the reference voltages Vr1 to Vrn stored in the nonvolatile memory 130 are examples of various setting values. The readout circuit 120 reads the values of the reference voltages Vr1 to Vrn from the nonvolatile memory 130 and sets the read values in the corresponding comparators 161 to 16*n*.

The comparator 161 is configured to switch the switch SW1 from OFF to ON when an output of the operational amplifier 111 exceeds the reference voltage Vr1. Thus, a first negative feedback circuit is formed that goes from the output terminal of the operational amplifier 112 back to the input terminal of the operational amplifier 112 through the switch SW1 and the resistor R1. The correction circuit 150 corrects an output signal of the operational amplifier 111 by using a gain determined by the resistor R1. As a result, a nonlinear distortion in an output signal of the magnetic sensor circuit 50 is corrected.

The comparator 162 switches the switch SW2 from OFF to ON when an output of the operational amplifier 111 exceeds the reference voltage Vr2. Thus, in addition to the first negative feedback circuit, a loop of a second negative feedback circuit is formed that goes from the output terminal of the operational amplifier 112 back to the input terminal of the operational amplifier 112 through the switch SW2 and the resistor R2. This configuration also enables the magnitude of the gain of the correction circuit 150 used for linearity correction to be switched.

The comparator 16*n* switches the switch SWn from OFF to ON when an output of the operational amplifier 111 exceeds the reference voltage Vrn. Thus, in addition to the first negative feedback circuit, the second negative feedback circuit, and so forth, a loop of a n-th negative feedback circuit is formed that goes from the output terminal of the operational amplifier 112 back to the input terminal of the operational amplifier 112 through the switch SWn and the resistor Rn. This configuration also enables the magnitude of the gain of the correction circuit 150 used for linearity correction to be switched.

Hence, as an output signal of the operational amplifier 111 increases, a feedback signal that goes from the output terminal of the operational amplifier 112 back to the input terminal through the negative feedback circuit of the operational amplifier 112 increases, resulting in an increase in the amount of correction used for linearity correction.

As described above, when the reference voltages Vr1 to Vrn are set to values different from each other, a plurality of correction points can be set in the correction circuit 150. The more correction points, the more finely linearity can be adjusted. When linearity is finely adjusted, the output of the operational amplifier 111 can be brought close to target characteristics.

Moreover, the correction circuit 150 is configured such that when the output of the operational amplifier 111 is the reference voltage Vr1 or less, outputs of all the comparators 161 to 16*n* enter an OFF state. At this time, the negative feedback circuit of the operational amplifier 112 is opened, and a state in which no correction by the correction circuit 150 is performed is entered.

FIG. 1 illustrates an example of the correction circuit 150 including components "switch SW1, resistor R1", "switch SW2, resistor R2", and so forth, and "switch SWn, resistor Rn" that are connected in parallel. However, the correction circuit 150 may include these components that are connected in series and may be configured so that a signal for switching the switch of each component ON/OFF is input to the switch.

(Linearity Correction)

Figure 2:
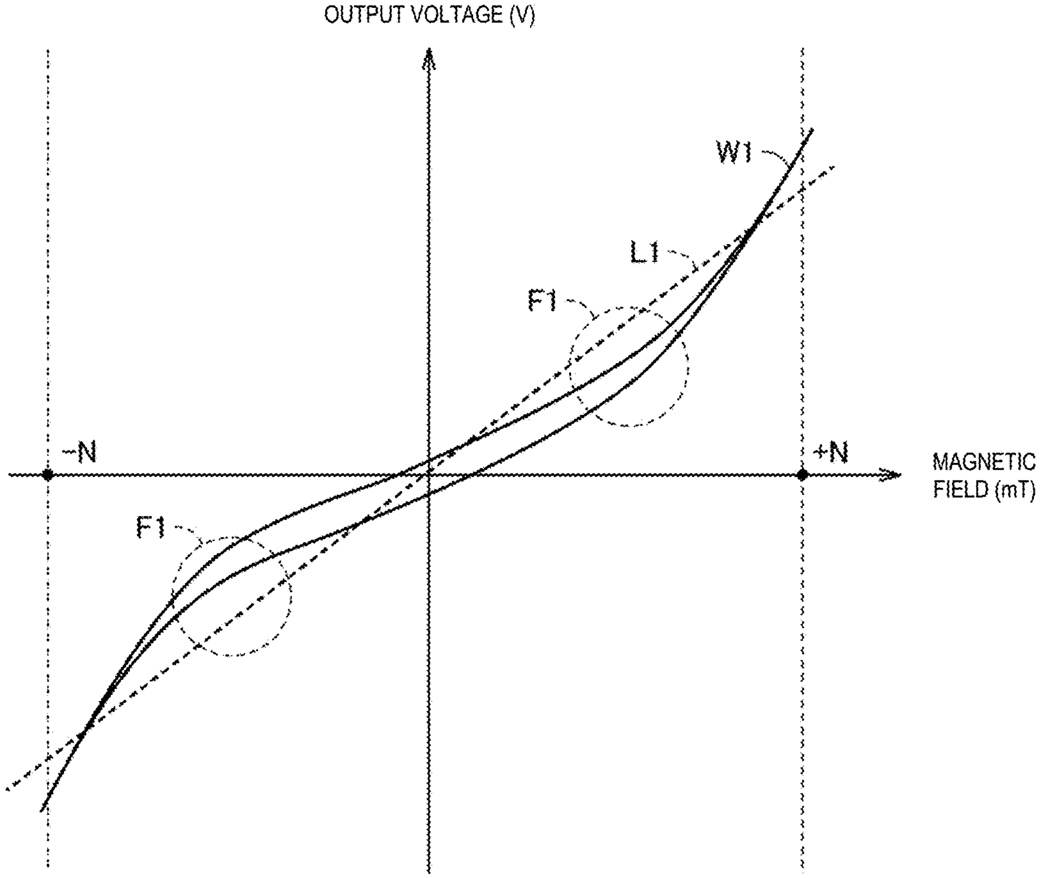
FIG. 2 is a graph illustrating a relationship between a waveform representing characteristics of an output voltage of a magnetic sensor circuit with respect to a magnetic field and a first approximate straight line.
Figure 3:
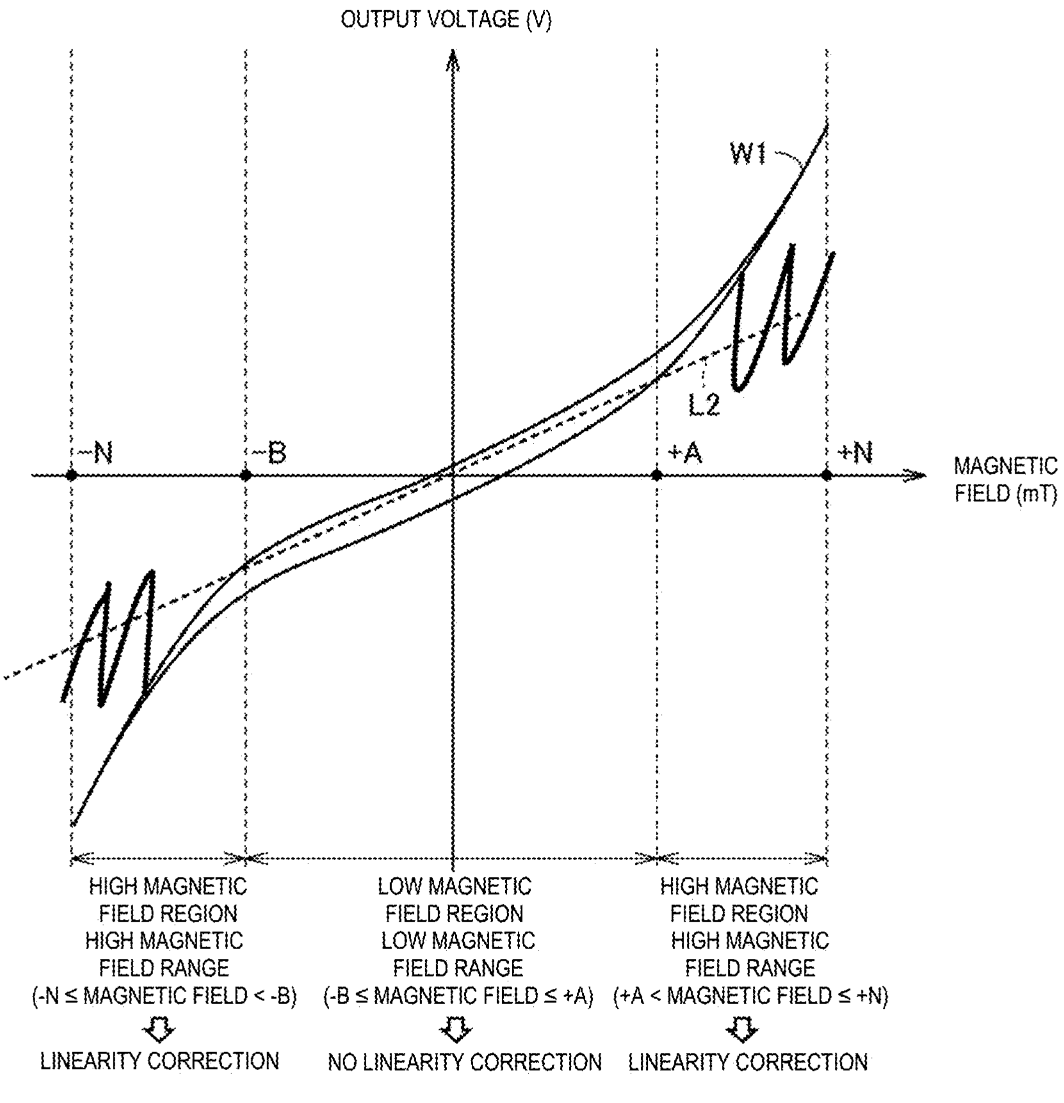
FIG. 3 is a graph illustrating relationships between magnetic field regions (a high magnetic field region and a low magnetic field region) and whether or not linearity correction is performed.

Next, referring to FIGS. 2 and 3, linearity correction according to the exemplary embodiment will be described. FIG. 2 is a graph illustrating a relationship between a waveform W1 representing characteristics of an output voltage of the magnetic sensor circuit 50 with respect to a magnetic field and a first approximate straight line L1. FIG. 3 is a graph illustrating relationships between magnetic field regions (e.g., a high magnetic field region and a low magnetic field region) and whether or not linearity correction is performed.

As indicated by the waveform W1 in FIG. 2, the output of the magnetic sensor circuit 50 has hysteresis and nonlinear characteristics. When an output voltage of the magnetic sensor circuit 50 is measured while changing the magnitude of the magnetic field, such a waveform W1 is obtained. The first approximate straight line L1 is a straight line representing ideal output characteristics of the magnetic sensor circuit 50 with respect to the magnetic field. A linear function for drawing such an ideal straight line can be calculated by using measurement results of the output voltage of the magnetic sensor circuit 50 with respect to the magnetic field. In particular, the first approximate straight line L1 is derived by using all measurement results in a magnetic field range (−N to +N) (millitesla (mT)).

If the output from the magnetic sensor circuit 50 is corrected in accordance with the first approximate straight line L1, an issue arises where an error between the first approximate straight line L1 and the output of the magnetic sensor circuit 50 is large in a portion indicated by a circular frame F1 in the waveform W1. To deal with this issue, when a curve portion where the error is large is not used, an issue arises where the dynamic range of the magnetic sensor circuit 50 that can be used as a sensor is narrow.

In general, there can also be a magnetic field range where an error between an output signal from a magnetic sensor circuit and an approximate straight line is small. For example, in a low magnetic field region in which an absolute value of a magnetic field is in a predetermined range, the error is small. Output signals in a range including such a low magnetic field region are to be subjected to linearity correction, not only resulting in a decrease in the speed of response of a sensor amplifier circuit, but also even causing an increase in error.

Thus, as illustrated in FIG. 3, the sensor amplifier circuit 100 is configured so that, of a magnetic field range −N to +N where the magnetic sensor circuit 50 is to perform sensing, the correction circuit 150 does not operate in a magnetic field range (−B≤magnetic field≤+A) of a low magnetic field region and the correction circuit 150 operates in a magnetic field range (−N≤magnetic field<−B, +A<magnetic field≤+N) of a high magnetic field region.

As illustrated in FIG. 3, in the high magnetic field region, the nonlinearity of the waveform W1 is strengthened by the influence of characteristics of the magnetic sensor circuit 50. In other words, in the high magnetic field region, the linearity of the magnetic sensor circuit 50 deteriorates. A gain setting value and an offset setting value of the operational amplifier 111 are calculated in accordance with a second approximate straight line L2. The second approximate straight line L2 is derived by using measurement results of the output voltage of the magnetic sensor circuit 50 in the low magnetic field region. For that reason, an error between the output of the magnetic sensor circuit 50 and the output of the operational amplifier 111 is small in the low magnetic field region, but the error between the output of the magnetic sensor circuit 50 and the output of the operational amplifier 111 is large in the high magnetic field region.

Thus, the sensor amplifier circuit 100 is configured to control the correction circuit 150 to operate in the high magnetic field region to perform linearity correction. As a result, the sensor amplifier circuit 100 brings output characteristics of the operational amplifier 111 close to the second approximate straight line L2, which is an ideal straight line.

Referring to FIGS. 1 and 3, linearity correction performed by the sensor amplifier circuit 100 will be described further. Incidentally, to obtain the waveform W1 illustrated in FIGS. 2 and 3, an output voltage of the magnetic sensor circuit 50 may be measured, or an output ("OUT" at the output terminal T3) of the sensor system 10 including the magnetic sensor circuit 50 and the sensor amplifier circuit 100 may be measured.

The operational amplifier 111 is configured to perform gain correction and offset adjustment so that an output signal from the magnetic sensor circuit 50 follows the second approximate straight line L2. As the reference voltage Vr1, a voltage corresponding to a boundary value between the magnetic field range of the low magnetic field region and the magnetic field range of the high magnetic field region is applied to the comparator 161. In the low magnetic field region, the switches SW1 to SWn of the correction circuit

150 are in an OFF state. For this reason, in the low magnetic field region, an output signal of the operational amplifier 111 is not corrected by the correction circuit 150 and is input to the output terminal T3 through the operational amplifier 112.

In the high magnetic field region, at least any one of the switches SW1 to SWn of the correction circuit 150 is in an ON state. For this reason, in the high magnetic field region, an output signal of the operational amplifier 111 is corrected by the correction circuit 150 and then is input to the output terminal T3 through the operational amplifier 112.

In the correction circuit 150, every time an output voltage of the operational amplifier 111 reaches a predetermined reference voltage set for each of the respective comparators 161 to 16*n*, the respective switches SW1 to SWn are switched ON. To address this, an offset is added so that the output voltage of the operational amplifier 111 is lowered. As a result, in the high magnetic field region, the output voltage of the operational amplifier 111 changes in stages at each correction point so that the output voltage follows an ideal linear output (the second approximate straight line L2). In FIG. 3, a zigzag line in the high magnetic field region represents the output voltage of the operational amplifier 111 changing in stages at each correction point.

Thus, when the output voltage of the operational amplifier 111 is a voltage corresponding to the low magnetic field region, the correction circuit 150 can be configured to switch all the switches SW1 to SWn OFF to perform no linearity correction. At this time, the sensor amplifier circuit 100 only amplifies, in the operational amplifier 111, an output voltage from the magnetic sensor circuit 50 with a gain appropriate to full scale that is demanded of the sensor. When the output of the operational amplifier 111 is a voltage corresponding to the high magnetic field region, the correction circuit 150 switches the magnitude of gain for linearity correction automatically. Thus, the gain is adjusted at each correction point automatically.

To improve the accuracy of sensor detection using linearity correction, many correction points have to be provided to perform linearity correction more finely. In this case, however, the number of the comparators 161 to 16*n* has to be increased. An increase in the number of the comparators 161 to 16*n* increases the size of the circuit, possibly hindering the miniaturization of an entire apparatus. For that reason, the number of the comparators 161 to 16*n* is selected as appropriate in consideration of the demanded accuracy of sensor detection and the permissible size of the sensor amplifier circuit 100.

(Calibration Procedure)

Figure 4:
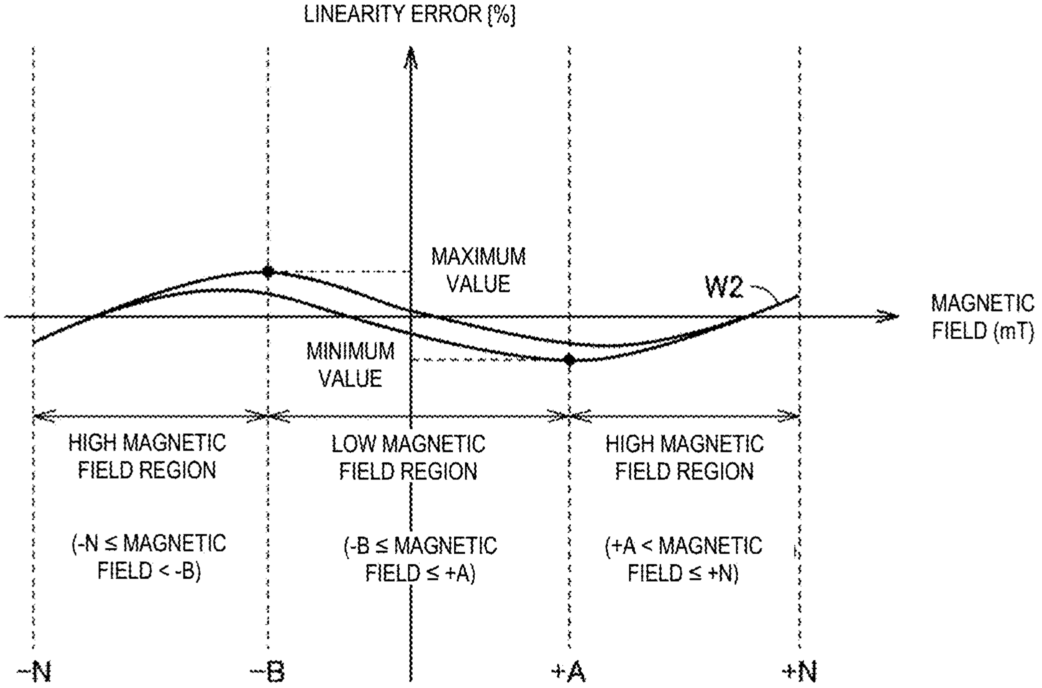
FIG. 4 is a graph illustrating a linearity error waveform.
Figure 5:
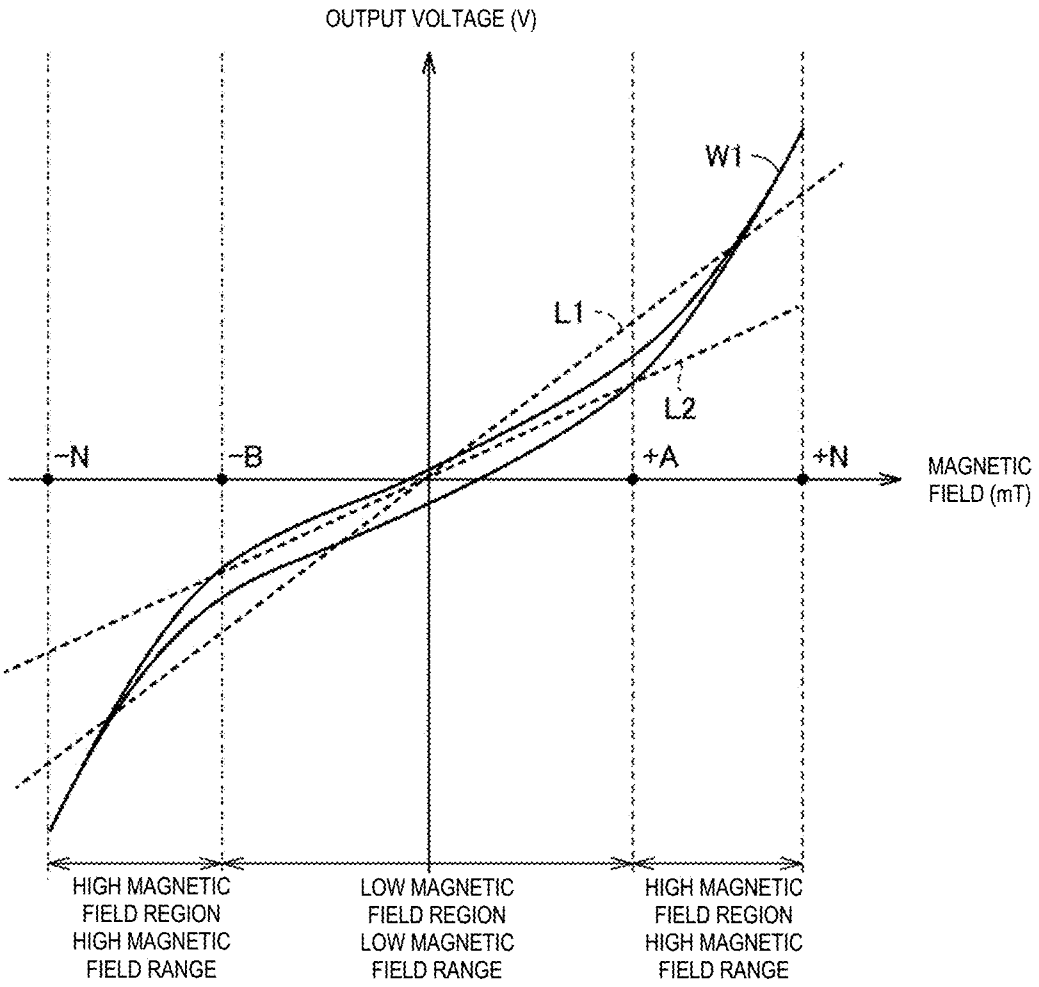
FIG. 5 is a graph illustrating a relationship between the waveform representing characteristics of the output voltage of the magnetic sensor circuit with respect to the magnetic field, the first approximate straight line, and a second approximate straight line.

Next, a procedure of calibrating the sensor amplifier circuit 100 will be described with reference to FIGS. 4 and 5. For more details, a procedure will be described here by which the magnetic field range of the low magnetic field region, the magnetic field range of the high magnetic field region, and the second approximate straight line L2 are determined. FIG. 4 is a graph illustrating a linearity error waveform W2. FIG. 5 is a graph illustrating a relationship between the waveform W1 representing characteristics of the output voltage of the magnetic sensor circuit 50 with respect to the magnetic field, the first approximate straight line L1, and the second approximate straight line L2.

A linearity error (%) is calculated by calculating a difference between the first approximate straight line L1 and the waveform W1 illustrated in FIG. 2. The waveform W2 (see FIG. 4) represents a relationship between the magnetic field and the linearity error calculated in this way. As illustrated in FIG. 4, a maximum value and a minimum value of the linearity error are identified from the linearity error waveform W2.

A magnetic field corresponding to the minimum value of the linearity error is set as a boundary magnetic field +A, and a magnetic field corresponding to the maximum value of the linearity error is set as a boundary magnetic field −B. At this time, the magnetic field range of the low magnetic field region is set as "−B≤magnetic field≤+A", and the magnetic field range of the high magnetic field region is set as "−N≤magnetic field<−B, +A<magnetic field≤+N". Thus, the magnetic field ranges of the low magnetic field region and the high magnetic field region are set in accordance with the first approximate straight line L1.

It is noted that, as for some types of magnetic sensor circuits, a linearity error waveform may be a waveform obtained by making the waveform W2 symmetrical about the X axis. It is noted that the exemplary embodiment can also be applied to such magnetic sensor circuits.

As with the first approximate straight line L1, the second approximate straight line L2 illustrated in FIG. 5 is derived as an ideal straight line of a sensor output signal with respect to the magnetic field. As already described, the first approximate straight line L1 is derived by using all measurement results in the magnetic field range (−N to +N) (mT). On the other hand, the second approximate straight line L2 is derived by using only measurement results in the low magnetic field region (−B to +A) (mT).

Consequently, the second approximate straight line L2 offers a higher degree of accuracy in approximating the output characteristics of the magnetic sensor circuit 50 in the low magnetic field region than the first approximate straight line L1. As illustrated in FIG. 5, the second approximate straight line L2 reflects the output characteristics of the magnetic sensor circuit 50 in the low magnetic field region better than the first approximate straight line L1.

For that reason, in comparison with a case where a gain correction value and an offset adjustment value of the operational amplifier 111 are designed in accordance with the first approximate straight line L1, when a gain correction value and an offset adjustment value of the operational amplifier 111 are designed in accordance with the second approximate straight line L2, the accuracy of an output signal of the operational amplifier 111 in the low magnetic field region is increased. Because of this reason, the gain correction value and the offset adjustment value of the operational amplifier 111 are designed in accordance with the second approximate straight line L2.

Consequently, the sensor amplifier circuit 100 provides a highly accurate output signal from the operational amplifier 111 in the low magnetic field region. Hence, in the low magnetic field region, the correction circuit 150 does not have to be caused to operate. When the correction circuit 150 is caused to operate in the low magnetic field region, unnecessary linearity correction is added, and there is even a possibility that the accuracy of the output signal of the operational amplifier 111 may decrease. Rather, the correction circuit 150 is not caused to operate in the low magnetic field region to bring about the advantage that the speed of response of the sensor amplifier circuit 100 in the low magnetic field region is increased. Because of these reasons, the sensor amplifier circuit 100 does not cause the correction circuit 150 to operate in the low magnetic field region.

On the other hand, the sensor amplifier circuit 100 causes the correction circuit 150 to operate in the high magnetic field region. Thus, as already described with reference to FIG. 3, the output voltage of the operational amplifier 111 changes in stages at each correction point so that the output voltage follows an ideal linear output (e.g., the second approximate straight line L2). Hence, the sensor amplifier circuit 100 according to the exemplary embodiment makes it possible to improve linearity while ensuring high responsiveness.

(Control Device)

Figure 6:
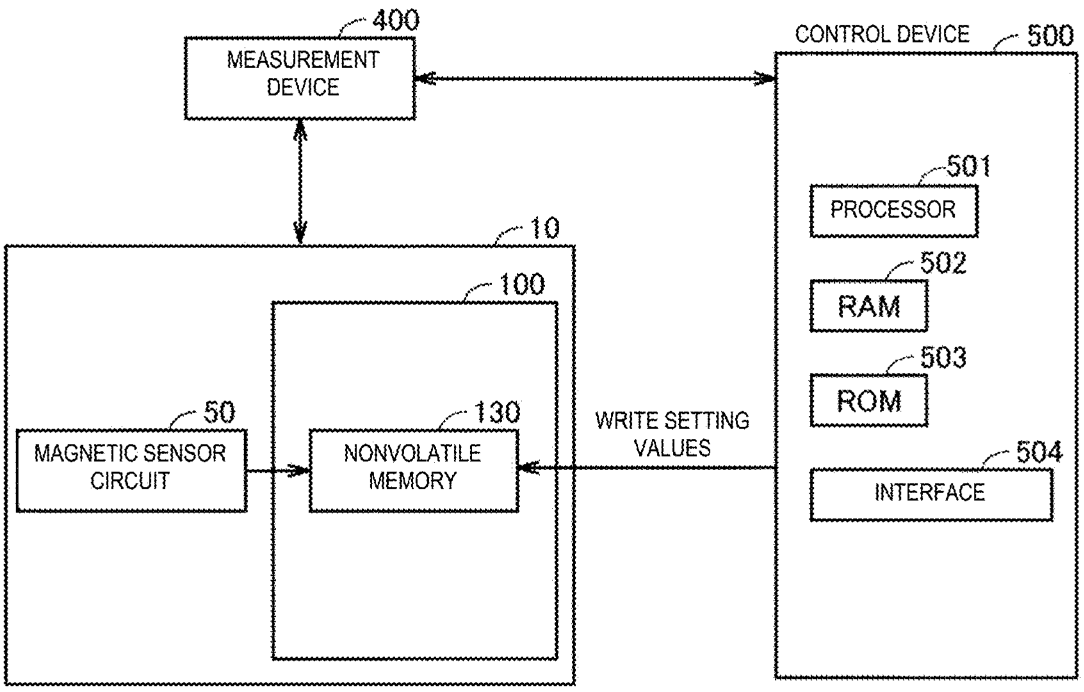
FIG. 6 is a block diagram illustrating a configuration of a control device used for calibrating the sensor amplifier circuit.

FIG. 6 is a block diagram illustrating a configuration of a control device 500 used for calibrating the sensor amplifier circuit 100.

In exemplary aspect, the control device 500 can be a computer (e.g., a computing device). Specifically, the control device 500 can include a processor 501, Random Access Memory (RAM) 502, Read Only Memory (ROM) 503, and an interface 504 for communication. The control device 500 executes various processes in accordance with a program stored in the ROM 503 while using the RAM as a work area in order to perform the algorithms described herein.

The control device 500 is connected to the nonvolatile memory 130 via the interface 504. The control device 500 is connected to a measurement device 400 via the interface 504.

The control device 500 executes various processes for calibrating the sensor amplifier circuit 100. First, the control device 500 controls the measurement device 400 to measure an output voltage of the magnetic sensor circuit 50 while changing a magnetic field (e.g., a measurement process). Second, the control device 500 uses measurement results to determine various setting values for the sensor amplifier circuit 100 (e.g., a determination process). Third, the control device 500 writes the determined setting values into the nonvolatile memory 130 (e.g., a write process). The control device 500 executes at least the first to third processes described above.

Next, a procedure of calibrating the sensor amplifier circuit 100 implemented by the control device 500 will be described in accordance with a flowchart.

Figure 7:
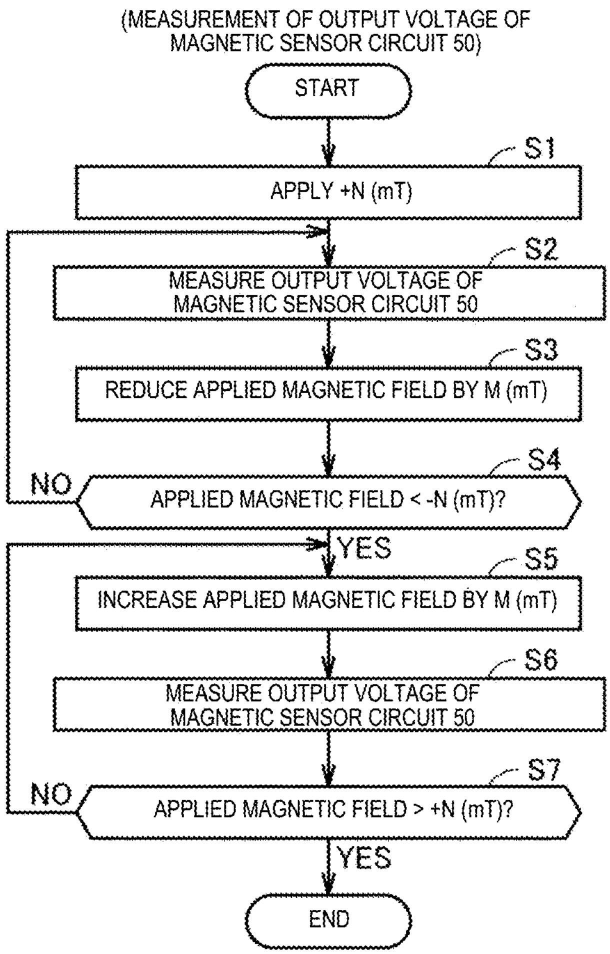
FIG. 7 is a flowchart illustrating a procedure by which an output voltage from the magnetic sensor circuit with respect to a magnetic field is measured.

FIG. 7 is a flowchart illustrating a procedure by which an output voltage from the magnetic sensor circuit 50 with respect to a magnetic field is measured. The control device 500 can obtain the waveform W1 illustrated in FIG. 2 by using measurement results based on this flowchart. A process based on this flowchart is executed by the control device 500. The process will be described below in accordance with the flowchart. To obtain the waveform W1, note that an example will be given where an output voltage of the magnetic sensor circuit 50 is measured. To obtain the waveform W1, however, in place of measuring an output voltage of the magnetic sensor circuit 50, an output ("OUT" at the output terminal T3) of the sensor system 10 including the magnetic sensor circuit 50 and the sensor amplifier circuit 100 may be measured.

First, the control device 500 controls the measurement device 400 so that a magnetic field of +N (mT) is applied to the magnetic sensor circuit 50 (step S1). Next, the control device 500 causes the measurement device 400 to measure an output voltage of the magnetic sensor circuit 50 (step S2). The measurement device 400 measures an output voltage of the magnetic sensor circuit 50 with respect to the magnetic field of +N (mT). The measurement device 400 transmits a measurement result to the control device 500. The control device 500 stores the measurement result. In the same way, the measurement device 400 transmits a measurement result to the control device 500 each time the measurement device 400 performs a measurement, and the control device 500 stores the measurement result.

Next, the control device 500 controls the measurement device 400 so that the magnetic field applied to the magnetic sensor circuit 50 decreases from +N (mT) by M (mT) (step S3). Here, the magnitude of M (mT) is the range of change in the magnetic field in measuring an output voltage of the magnetic sensor circuit 50 while changing the magnetic field. Under the control of the control device 500, the measurement device 400 measures an output voltage of the magnetic sensor circuit 50 while reducing the magnetic field from +N (mT) by M (mT).

Next, the control device 500 determines whether or not the magnetic field applied to the magnetic sensor circuit 50 has fallen below −N (mT), which is a lower limit of a magnetic field range width (step S4). It is noted that the control device 500 can be configured to repeat operations of steps S1 to S3 until the magnetic field applied to the magnetic sensor circuit 50 falls below −N (mT).

When the magnetic field applied to the magnetic sensor circuit 50 falls below −N (mT), the measurement device 400 measures an output voltage of the magnetic sensor circuit 50 while increasing the magnetic field from −N (mT) by M (mT). For this purpose, the control device 500 controls the measurement device 400 so that the magnetic field applied to the magnetic sensor circuit 50 increases from −N (mT) by M (mT) (step S5). Next, the control device 500 causes the measurement device 400 to measure an output voltage of the magnetic sensor circuit 50 (step S6). At this time, the measurement device 400 measures an output voltage of the magnetic sensor circuit 50 with respect to a magnetic field of −N+M (mT).

Next, the control device 500 determines whether or not the magnetic field applied to the magnetic sensor circuit 50 has exceeded +N (mT), which is an upper limit of the magnetic field range width (step S7). The control device 500 repeats operations of steps S5 to S7 until the magnetic field applied to the magnetic sensor circuit 50 exceeds +N (mT). When the magnetic field applied to the magnetic sensor circuit 50 exceeds +N (mT), which is the upper limit of the magnetic field range width, the control device 500 ends the process based on this flowchart. The control device 500 executes operations of steps S1 to 7 to acquire data for drawing the waveform W1 illustrated in FIG. 2.

Figure 8:
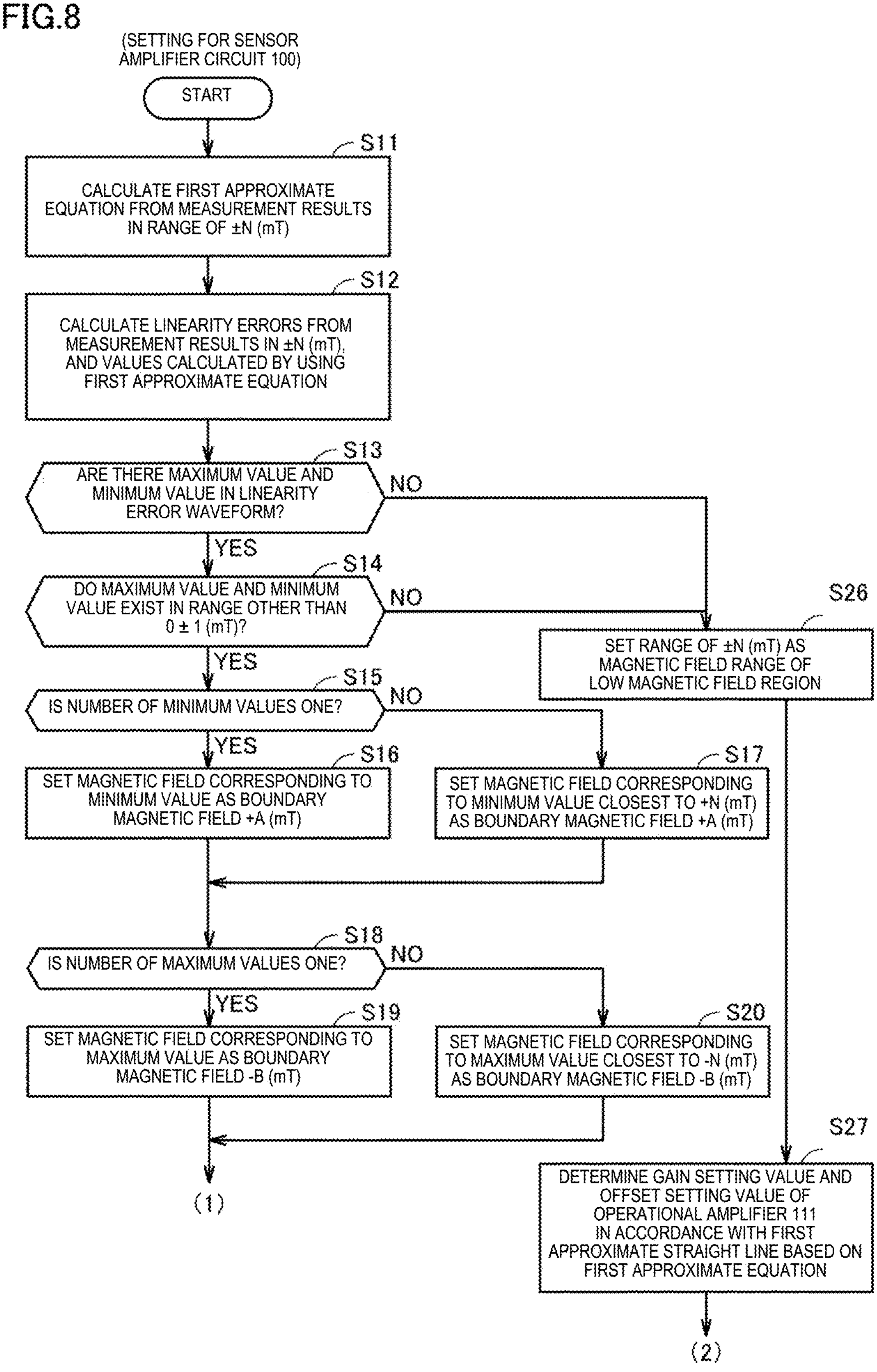
FIG. 8 is a flowchart illustrating a procedure for determining various setting values for the sensor amplifier circuit.
Figure 9:
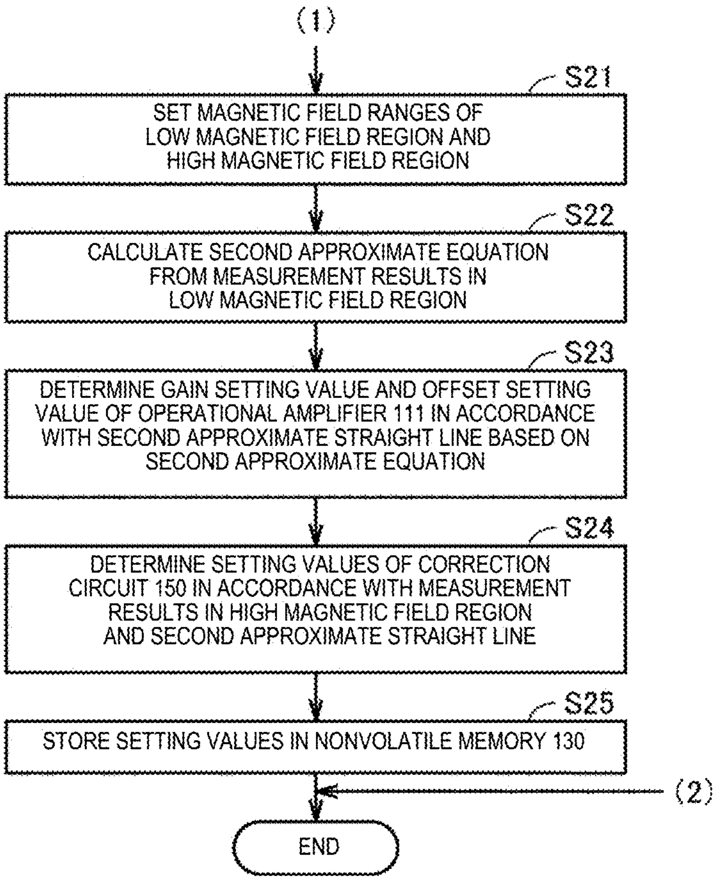
FIG. 9 is the flowchart illustrating the procedure for determining various setting values for the sensor amplifier circuit.

FIGS. 8 and 9 are a flowchart illustrating a procedure for determining various setting values for the sensor amplifier circuit 100. When a process based on this flowchart is executed, a gain setting value and an offset setting value of the operational amplifier 111, and setting values of the correction circuit 150 are determined. Among the setting values of the correction circuit 150 are values of the reference voltages Vr1 to Vrn for the comparators 161 to **16*n*. The process based on this flowchart is executed by the control device 500**. The process will be described below in accordance with the flowchart.

First, the control device 500 calculates a first approximate equation for identifying the first approximate straight line L1 from measurement results of the output voltage of the magnetic sensor circuit 50 in a range of +N (mT) (step S11). The control device 500 calculates the first approximate equation, for example, by using the method of least squares. The first approximate equation is a linear function expressed in a form "output voltage=slope×X (input magnetic field)+offset". The control device 500 may display the first approximate straight line L1 (see FIG. 2) on a monitor or the like by using the calculated first approximate equation.

Next, the control device 500 calculates linearity errors from the measurement results of the output voltage of the magnetic sensor circuit 50 in the range of +N (mT), and values calculated by using the first approximate equation (step S12). The control device 500 may display the linearity error waveform W2 (see FIG. 4) on a monitor or the like by using the calculated linearity errors.

Next, the control device 500 determines whether or not there are a maximum value and a minimum value in the linearity error waveform W2 (step S13). A maximum value and a minimum value are illustrated in FIG. 4.

When there are a maximum value and a minimum value in the linearity error waveform W2, the control device 500 determines whether or not the maximum value and the minimum value exist in a magnetic field range other than 0±1 (mT) (step S14). Only when the maximum value and the minimum value exist in the magnetic field range other than 0±1 (mT), the control device 500 sets the boundary magnetic fields +A and −B (see FIG. 4) in accordance with them. Around 0 (mT), hysteresis characteristics of the magnetic sensor circuit 50 are strongly exhibited. For this reason, the control device 500 does not set the boundary magnetic fields +A and −B when the maximum value and the minimum value exist only in the magnetic field range of 0±1 (mT).

Hence, when there are no maximum value and no minimum value in the linearity error waveform W2 (NO in step 13), and when the maximum value and the minimum value exist only in the magnetic field range of 0±1 (mT) (NO in step 14), the control device 500 sets the entire range of +N (mT) as the magnetic field range of the low magnetic field region (step S26). As a result, no high magnetic field region is set in the range of +N (mT).

As described above, the sensor amplifier circuit 100 according to the exemplary embodiment performs linearity correction in the high magnetic field region and does not perform linearity correction in the low magnetic field region. Hence, when the entire magnetic field range of +N (mT) is set as the magnetic field range of the low magnetic field region, the sensor amplifier circuit 100 does not cause the correction circuit 150 to operate in the entire magnetic field region of +N (mT).

Next, the control device 500 determines a gain setting value and an offset setting value of the operational amplifier 111 in accordance with the first approximate straight line L1 based on the first approximate equation (step S27).

When the control device 500 determines in step S14 that the maximum value and the minimum value exist in the magnetic field range other than 0±1 (mT), the control device 500 sets the boundary magnetic fields +A and −B. However, before setting the boundary magnetic fields +A and −B, the control device 500 determines the numbers of minimum values and maximum values that exist in the magnetic field range other than 0±1 (mT).

The numbers of minimum values and maximum values that exist in the magnetic field range other than 0±1 (mT) are not necessarily one each. In some relationships between hysteresis characteristics of the magnetic sensor circuit 50 and the first approximate equation, a plurality of minimum values or maximum values may exist in the magnetic field range other than 0±1 (mT). When only one minimum value exists in the magnetic field range other than 0±1 (mT) (YES in step S15), the control device 500 sets the magnitude of a magnetic field corresponding to the minimum value as the boundary magnetic field +A (mT) (step S16).

When a plurality of minimum values exist in the magnetic field range other than 0±1 (mT) (NO in step S15), the control device 500 sets, of the plurality of minimum values, the magnitude of a magnetic field corresponding to a minimum value closest to +N (mT) illustrated in FIG. 4 as the boundary magnetic field +A (mT) (step S17).

When only one maximum value exists in the magnetic field range other than 0±1 (mT) (YES in step S18), the control device 500 sets the magnitude of a magnetic field corresponding to the maximum value as the boundary magnetic field −B (mT) (step S19). When a plurality of maximum values exist in the magnetic field range other than 0±1 (mT) (NO in step S18), the control device 500 sets, of the plurality of maximum values, the magnitude of a magnetic field corresponding to a maximum value closest to −N (mT) illustrated in FIG. 4 as the boundary magnetic field −B (mT) (step S20).

Next, the control device 500 sets the magnetic field ranges of the low magnetic field region and the high magnetic field region in accordance with the boundary magnetic fields +A and −B (step S21). More specifically, the control device 500 sets "−B≤magnetic field≤+A" as the magnetic field range of the low magnetic field region. The control device 500 sets "−N≤magnetic field<−B, +A<magnetic field≤+N" as the magnetic field range of the high magnetic field region.

Next, the control device 500 calculates a second approximate equation for identifying the second approximate straight line L2 from measurement results of the output voltage of the magnetic sensor circuit 50 in the low magnetic field region (step S22). The control device 500 calculates the second approximate equation, for example, by using the method of least squares. As with the first approximate equation, the second approximate equation is a linear function expressed in a form "output voltage=slope×X (input magnetic field)+offset". The control device 500 may display the second approximate straight line L2 (see FIG. 3) on a monitor or the like by using the calculated second approximate equation.

Next, the control device 500 determines a gain setting value and an offset setting value of the operational amplifier 111 in accordance with the second approximate straight line L2 based on the second approximate equation (step S23). More specifically, the control device 500 first derives the slope and offset of the second approximate straight line L2. Next, the control device 500 determines a gain setting value and an offset setting value from full scale demanded of a sensing function of the magnetic sensor circuit 50, and a value of a voltage when the magnetic field is at 0 (mT). Thus, the gain setting value is determined in accordance with the output characteristics of the magnetic sensor circuit 50 in the low magnetic field region.

Next, the control device 500 determines setting values of the correction circuit 150 in accordance with measurement results of the output voltage of the magnetic sensor circuit 50 in the high magnetic field region and the second approximate straight line L2 (step S24). Thus, the reference voltages Vr1 to Vrn for the comparators 161 to **16*n* are determined as setting values of the correction circuit 150**.

Next, the control device 500 stores the setting values of the correction circuit 150 in the nonvolatile memory 130 (step S25) and ends the process based on this flowchart. It is noted that the control device 500 may also store the setting values determined in step S23 or step S27 in the nonvolatile memory 130.

The procedure of calibrating the sensor amplifier circuit 100 has been described above with reference to FIGS. 7 and 8. The procedure of calibrating the sensor amplifier circuit 100 by using the control device 500, which is an example computer, has been described here. However, at least some steps of the above-described procedure may be executed manually by a person in charge of calibration in place of the control device 500.

In the above description, an example has been given where "−B≤magnetic field≤+A" is set as the magnetic field range of the low magnetic field region, and "−N≤magnetic field<−B, +A<magnetic field≤+N" is set as the magnetic field range of the high magnetic field region. However, the control device 500 may set the magnetic field ranges of the low magnetic field region and the high magnetic field region in accordance with only one of the boundary magnetic fields +A and −B illustrated in FIG. 4.

For example, the control device 500 may set "−A≤magnetic field≤+A" as the magnetic field range of the low magnetic field region. Alternatively, the control device 500 may set "−B≤magnetic field≤+B" as the magnetic field range of the low magnetic field region. After determining the magnetic field range of the low magnetic field region, the control device 500 has only to set a region obtained by removing the magnetic field range of the low magnetic field region from the range of +N (mT) as the magnetic field range of the high magnetic field region.

In an exemplary aspect, the second approximate equation may be calculated by selecting any magnetic field belonging to the magnetic field range of the low magnetic field region and using measurement results of the output voltage of the magnetic sensor circuit 50 in a range of that magnetic field.

Incidentally, when a boundary magnetic field is determined from measurement results (e.g., from calibration data) of output voltages of a plurality of magnetic sensor circuits 50, the magnetic field range of the low magnetic field region does not necessarily have to be set with reference to magnetic fields corresponding to a maximum point and a minimum point. For example, as the magnetic field range of the low magnetic field region, a range may be set that is wider than the magnetic field range of the low magnetic field region set with reference to the magnetic fields corresponding to the maximum point and the minimum point.

(Comparison with Existing Sensor Amplifier Circuit)

As described above, the sensor amplifier circuit 100 does not cause the correction circuit 150 to operate in the low magnetic field region and causes the correction circuit 150 to operate in the high magnetic field region. There is an existing sensor amplifier circuit that performs linearity correction on a signal output from a sensor at all times. In such an existing sensor amplifier circuit, for example, an arithmetic unit that performs an operation for linearity correction is incorporated in the sensor amplifier circuit.

In such an existing sensor amplifier circuit, the arithmetic unit has to be formed by a large-scale digital circuit, and thus a chip area gets larger, resulting in an issue where the sensor amplifier circuit gets larger. Furthermore, it takes time to perform arithmetic processing for linearity correction, thus reducing responsiveness.

If linearity correction is performed on an output from the sensor at all times, an issue arises where responsiveness decreases even further. To increase responsiveness, an operating frequency of the arithmetic unit may also be increased. However, a new issue arises where current consumption and high-frequency noise increase as the operating frequency of the arithmetic unit increases. Furthermore, if linearity correction is performed on an output from the sensor at all times, there is the possibility that an unnecessary operation is performed on an output that does not actually have to be corrected. In this case, an output error may also increase.

In the sensor amplifier circuit 100 according to the exemplary embodiment, the correction circuit 150 does not operate in the low magnetic field region, and thus responsiveness is increased in comparison with the existing sensor amplifier circuit that performs linearity correction on an output from the sensor at all times. In addition, in the sensor amplifier circuit 100, in the low magnetic field region, an output from the magnetic sensor circuit 50 is amplified with high accuracy in accordance with the second approximate straight line L2 corresponding to the low magnetic field region. For this reason, in the sensor amplifier circuit 100, even when the correction circuit 150 does not operate, accuracy does not decrease. Furthermore, the correction circuit 150 is an analog circuit, and thus the speed of response is increased in comparison with a case where the correction circuit 150 is a digital circuit.

Further effects achieved by the sensor amplifier circuit 100 according to the exemplary embodiment are given below. The sensor amplifier circuit 100 causes the operational amplifier 111 to only amplify an output signal of the magnetic sensor circuit 50 in the low magnetic field region, and the linearity performance of the magnetic sensor circuit 50 is used as it is. For this reason, factors responsible for errors are reduced, and the accuracy of sensor output with respect to a magnetic field in the low magnetic field region is also increased.

In an exemplary aspect, the sensor amplifier circuit 100 performs linearity correction on a sensor output by using the correction circuit 150 in a strong magnetic field region. This configuration enables a range in which the linearity of the relationship between the magnetic field and the output voltage is maintained to be broadened. As a result, the dynamic range of the magnetic sensor circuit 50 is broadened.

The sensor amplifier circuit 100 amplifies an output of the magnetic sensor circuit 50 in accordance with measurement results of the output voltage of the magnetic sensor circuit 50 in the low magnetic field region. For this reason, in the high magnetic field region, an error between the second approximate straight line L2 and the output of the magnetic sensor circuit 50 is large. However, the sensor amplifier circuit 100 causes the correction circuit 150 to operate, thereby enabling linearity correction to be performed so that ideal sensor output characteristics are approached even in the high magnetic field region. As a result, the dynamic range of the magnetic sensor circuit 50 that can be used as a sensor can be broadened. As described above, the sensor amplifier circuit 100 can perform linearity correction not in accordance with only characteristics of the magnetic sensor circuit 50, thus providing high versatility.

The sensor amplifier circuit 100 causes the correction circuit 150 to operate only in the high magnetic field region. This configuration enables the dynamic range of the magnetic sensor circuit 50 that can be used as a sensor to be broadened.

The correction circuit 150 is an analog circuit, and circuit operation is determined automatically and promptly by the magnitude of an applied voltage. Thus, the correction circuit 150 does not perform arithmetic processing including, for example, a feedback routine and is therefore excellent in the speed of response.

It is noted that the terms "operational amplifier 111" and "operational amplifier 112" in the exemplary embodiment respectively correspond to "first operational amplifier" and "second operational amplifier" in the present disclosure. Moreover, the terms "low magnetic field region" and "high magnetic field region" in the embodiment correspond to "first magnetic field region" and "second magnetic field region" in the present disclosure.

As illustrated in FIG. 3, the magnetic sensor circuit 50 outputs, in the low magnetic field region (e.g., a first magnetic field region) to which a magnetic field in a first range (−B≤magnetic field≤+A) has been applied, a first signal corresponding to the magnetic field in the first range and outputs, in the high magnetic field region (e.g., a second magnetic field region) to which a magnetic field in a second range (−N≤magnetic field<−B, +A<magnetic field≤+N) larger than the magnetic field in the first range has been applied, a second signal corresponding to the magnetic field in the second range.

The correction circuit 150 is configured to switch from the first state in which a nonlinear distortion contained in an output signal of the magnetic sensor circuit 50 is not corrected (all the switches SW1 to SWn are in an OFF state) to the second state in which a nonlinear distortion contained in an output signal of the magnetic sensor circuit 50 is corrected (any of the switches SW1 to SWn is in an ON state). When an output signal from the magnetic sensor circuit 50 changes from the first signal corresponding to the magnetic field in the first range to the second signal corresponding to the magnetic field in the second range, the correction circuit 150 switches from the first state to the second state.

When the first signal is input, the operational amplifier 111 outputs a signal based on a gain setting value and an offset setting value. The voltage of this signal is lower than the reference voltage Vr1 of the correction circuit 150, and thus all the switches SW1 to SWn of the correction circuit 150 remain in the OFF state.

When the second signal is input, the operational amplifier 111 outputs a signal based on a gain setting value and an offset setting value. The voltage of this signal is higher than any of the reference voltages Vr1 to Vrn of the correction circuit 150, and thus at least any of the switches SW1 to SWn of the correction circuit 150 switches from OFF to ON. In this way, the correction circuit 150 detects, in accordance with a change in the magnitude of an output signal from the operational amplifier 111, a change in the output signal from the magnetic sensor circuit 50 from the first signal to the second signal.

As illustrated in FIGS. 7 and 8, the method of calibrating the sensor amplifier circuit 100 includes the measuring an output voltage of the magnetic sensor circuit with respect to a magnetic field (steps S1 to S7); calculating, by using measurement results obtained by the measuring, a first relational equation (e.g., a first approximate equation) expressing a relationship between the magnetic field and the output voltage of the magnetic sensor circuit as a linear function (step S11); determining, in accordance with the first relational equation, and the measurement results obtained by the measuring, a maximum linearity error (e.g., a maximum value, minimum value) (steps S13, S14, S15, and S18); determining, by using the maximum linearity error, a boundary between the first range and the second range (steps S16, S17, S19, and S20); calculating, by using, of the measurement results obtained by the measuring, measurement results in the first magnetic field region, a second relational equation (second approximate equation) expressing a relationship between the magnetic field and the output voltage of the magnetic sensor circuit as a linear function (step S22); and determining, by using the second relational equation, a gain and an offset of the first operational amplifier (step S23).

(Modification of Sensor System)

Figure 10:
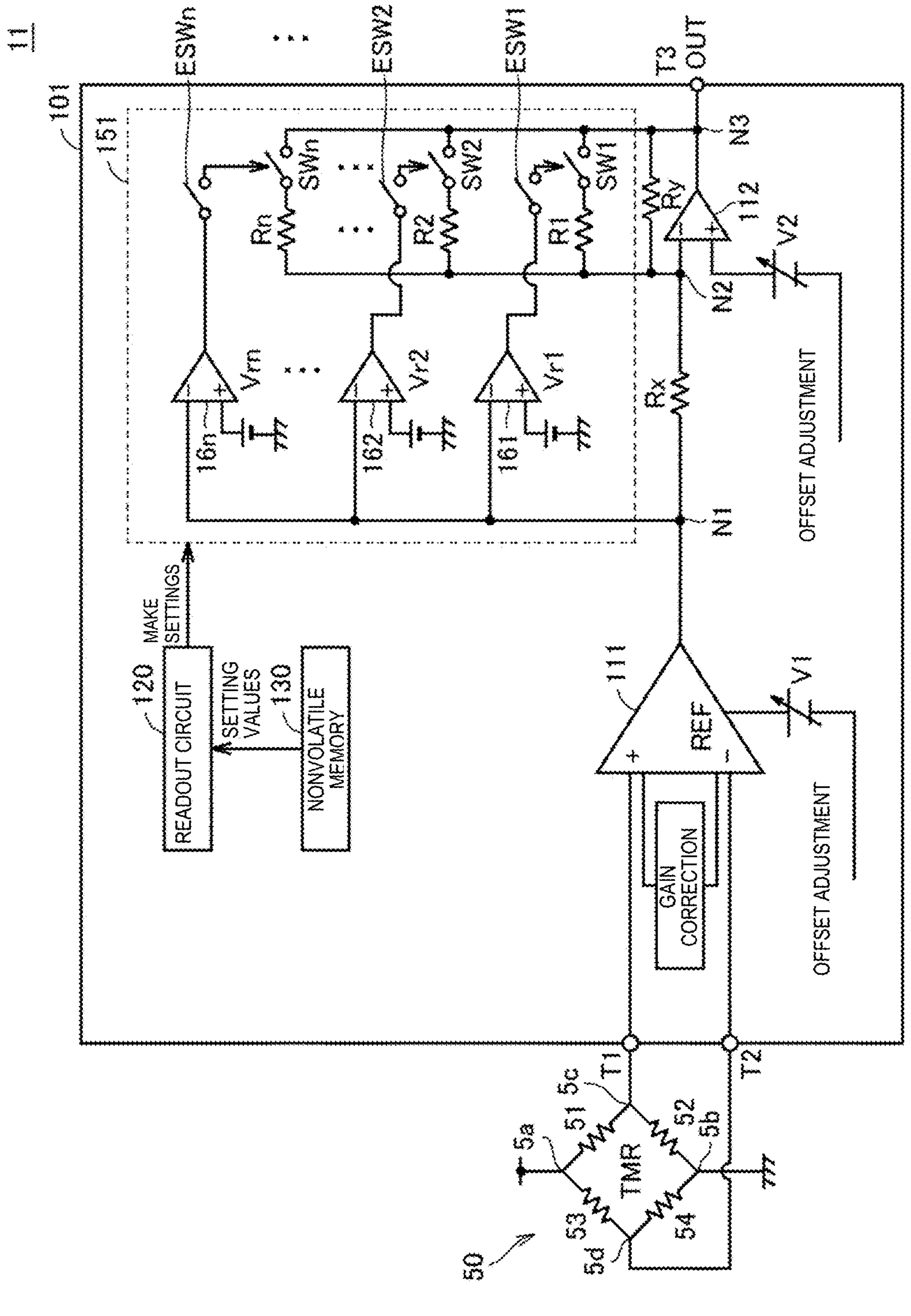
FIG. 10 is a schematic configuration diagram of a sensor system according to a modification of the exemplary embodiment.

FIG. 10 is a schematic configuration diagram of a sensor system 11 according to a modification of the exemplary embodiment. The sensor system 11 includes the magnetic sensor circuit 50 and a sensor amplifier circuit 101. The sensor amplifier circuit 101 includes a correction circuit 151. The sensor system 11 according to the modification differs from the sensor system 10 described above in the configuration of the correction circuit. In the correction circuit 151 according to the modification, Enable switches ESW1 to ESWn are added to components of the correction circuit 150.

The Enable switch ESW1 is disposed between the comparator 161 and the switch SW1. The Enable switch ESW2 is disposed between the comparator 162 and the switch SW2. The Enable switch ESWn is disposed between the comparator 16*n* and the switch SWn.

The readout circuit 120 is configured to perform control to switch the Enable switches ESW1 to ESWn ON/OFF.

As already described, as for values of the reference voltages Vr1 to Vrn used in the correction circuit 150, the relationship of Vr1<Vr2< . . . <Vrn holds. In other words, a linearity correction point is determined in accordance with the relationship of Vr1<Vr2< . . . <Vrn.

In an exemplary aspect when no linearity correction is performed, the readout circuit 120 switches all the Enable switches ESW1 to ESWn OFF. On the other hand, when linearity correction is performed at a correction point determined by any one of the comparators 161 to 16*n*, the readout circuit 120 switches, of the Enable switches ESW1 to ESWn, an Enable switch connected to the corresponding comparator ON and switches the other Enable switches OFF.

Moreover, when linearity correction is performed at correction points determined by any two of the comparators 161 to 16*n*, the readout circuit 120 switches, of the Enable switches ESW1 to ESWn, Enable switches connected to the two corresponding comparators ON and switches the other Enable switches OFF.

As described above, in the modification, the readout circuit 120 can perform linearity correction by using one of the comparators 161 to 16*n* and can also perform linearity correction by using two or more comparators of the comparators 161 to 16*n*. Hence, in the modification, the sensor system 11 and the sensor amplifier circuit 101 can be provided in which a comparator with a suitable voltage range can be freely selected. Furthermore, in the modification, the Enable switches ESW1 to ESWn are employed, thus enabling the comparators 161 to 16*n* to be kept from malfunctioning. For example, the switch SW1 can be kept from being switched ON due to a malfunction of the comparator 161 in spite of the fact that the voltage at the node N1 is the reference voltage Vr1 or less.

Incidentally, information on timing of switching the Enable switches ESW1 to ESWn ON/OFF is stored in the nonvolatile memory 130 as one of the setting values. More specifically, the nonvolatile memory 130 is configured to store registers used to control the Enable switches ESW1 to ESWn for the respective Enable switches ESW1 to ESWn. Moreover, the readout circuit 120 is configured to perform control to switch the Enable switches ESW1 to ESWn ON/OFF in accordance with setting values read from the nonvolatile memory 130.

In an exemplary aspect, the reference voltages Vr1 to Vrn are configured to function as a threshold voltage that determines the correction operation of the correction circuit 151. In the modification, a certain voltage range is set for each of the reference voltages Vr1 to Vrn. At this time, it is conceivable that the same voltage width (0.5 V) is set for each reference voltage, such as "2.5 V<Vr1<3.0 V", "2.8 V<Vr2<3.3 V", . . . and so forth. In this case, when the voltage at the node N1 is 3.0 V, the readout circuit 120 switches only Enable switch ESW2 ON and switches the other Enable switches OFF.

Here, assume that a resolution necessary for adjusting the threshold voltage is 0.1 V. For all voltages from 0 V to 5 V that can be observed at the node N1, if the range of adjustment in steps of 0.1 V is demanded, 50 steps of adjustment patterns are necessary. In this case, in the nonvolatile memory 130, a register area of six bits is necessary for one reference voltage. Hence, to support the reference voltages Vr1 to Vrn, a register area of "six bits×N" is necessary in the nonvolatile memory 130.

On the other hand, consider a case where the same voltage width (for example, 0.5 V) is set for each of the reference voltages Vr1 to Vrn. Assume that a resolution necessary for adjusting the threshold voltage is 0.1 V. In this case, the number of reference voltage adjustment patterns is limited to five, and thus the number of bits in a register area necessary for one reference voltage is three. To support the reference voltages Vr1 to Vrn, the nonvolatile memory 130 has only to have a register area of "three bits×N". Hence, the same voltage width (for example, 0.5 V) is set for each of the reference voltages Vr1 to Vrn, enabling a reduction in capacity necessary for the nonvolatile memory 130.

FIG. 10 illustrates an example of the correction circuit 151 including components "switch SW1, resistor R1", "switch SW2, resistor R2", . . . , and "switch SWn, resistor Rn" that are connected in parallel. However, the correction circuit 151 may include these components that are connected in series and may be configured so that a signal for switching the switch of each component ON/OFF is input to the switch through the corresponding Enable switch.

Exemplary Aspects

A sensor amplifier circuit is provided according to an exemplary aspect that is configured to amplify an output signal from a magnetic sensor circuit. In this aspect, the sensor amplifier circuit includes a first operational amplifier configured to amplify an output signal from the magnetic sensor circuit; and a correction circuit configured to correct a nonlinear distortion contained in the output signal. In this aspect, the magnetic sensor circuit outputs, in a first magnetic field region to which a magnetic field in a first range has been applied, a first signal with a magnitude corresponding to the magnetic field in the first range and outputs, in a second magnetic field region to which a magnetic field in a second range larger than the magnetic field in the first range has been applied, a second signal with a magnitude corresponding to the magnetic field in the second range. Moreover, the correction circuit is configured to switch from a first state in which a nonlinear distortion contained in the output signal is not corrected to a second state in which a nonlinear distortion contained in the output signal is corrected. When an output signal from the magnetic sensor circuit changes from the first signal to the second signal, the correction circuit switches from the first state to the second state.

In a refinement of the sensor amplifier circuit according to exemplary aspect, when an output signal from the magnetic sensor circuit changes from the first signal to the second signal, the correction circuit switches from the first state to the second state automatically.

In a refinement of the sensor amplifier circuit according to an exemplary aspect, the correction circuit detects, in accordance with a change in a magnitude of an output signal from the first operational amplifier, a change in an output signal from the magnetic sensor circuit from the first signal to the second signal.

In a refinement of the sensor amplifier circuit according to an exemplary aspect, the first operational amplifier amplifies an output signal from the magnetic sensor circuit in accordance with a predetermined gain, and the gain is a value determined in accordance with output characteristics of the magnetic sensor circuit in the first magnetic field region.

In a refinement of the sensor amplifier circuit according to an exemplary aspect, the amplifier further comprises memory in which a setting value of the correction circuit is stored; and a readout circuit configured to read the setting value stored in the memory and set the setting value in the correction circuit.

In a refinement of the sensor amplifier circuit according to an exemplary aspect, the magnetic sensor circuit includes four sensor elements connected in a bridge configuration, and wherein the first operational amplifier amplifies a differential voltage between a pair of output signals from the magnetic sensor circuit.

In a refinement of the sensor amplifier circuit according to an exemplary aspect, the magnetic sensor circuit includes a magnetic sensor element, and the magnetic sensor element is a Tunneling Magneto-Resistive (TMR) element.

In a refinement of the sensor amplifier circuit according to an exemplary aspect, the amplifier further comprises a second operational amplifier. In this aspect, an output terminal of the first operational amplifier and an inverting input terminal of the second operational amplifier are connected to each other, the correction circuit includes a first negative feedback circuit and a second negative feedback circuit connected in parallel between an output terminal of the second operational amplifier and the inverting input terminal of the second operational amplifier, and a first comparator and a second comparator, the first negative feedback circuit includes a first resistor, and a first switch configured to open and close the first negative feedback circuit, the second negative feedback circuit includes a second resistor, and a second switch configured to open and close the second negative feedback circuit, the first comparator closes the first switch when an output voltage of the first operational amplifier reaches a first reference voltage, and the second comparator closes the second switch when an output voltage of the first operational amplifier reaches a second reference voltage larger than the first reference voltage.

Moreover, a sensor system is provided that comprises the magnetic sensor circuit and the sensor amplifier circuit described herein.

In another exemplary aspect, a method of calibrating the sensor amplifier circuit is provided that includes measuring an output voltage of the magnetic sensor circuit with respect to a magnetic field; calculating, by using measurement results obtained by the measuring, a first relational equation expressing a relationship between the magnetic field and the output voltage of the magnetic sensor circuit as a linear function; determining, in accordance with the first relational equation, and the measurement results obtained by the measuring, a maximum linearity error; determining, by using the maximum linearity error, a boundary between the first range and the second range; calculating, by using, of the measurement results obtained by the measuring, measurement results in the first magnetic field region, a second relational equation expressing a relationship between the magnetic field and the output voltage of the magnetic sensor circuit as a linear function; and determining, by using the second relational equation, a gain and an offset of the first operational amplifier.

It is noted that the exemplary embodiment disclosed herein is illustrative and not restrictive in any respect.

REFERENCE SIGNS LIST

5*a*, 5*b* power supply terminal, 5*c*, 5*d* signal output terminal, 10, 11 sensor system, 50 magnetic sensor circuit, 51, 52, 53, 54 sensor element, 100, 101 sensor amplifier circuit, 111, 112 operational amplifier, 120 readout circuit, 130 nonvolatile memory, 150, 151 correction circuit, 161 to 16*n* comparator, 190 output amplifier, 400 measurement device, 500 control device, 501 processor, 502 RAM, 503 ROM, 504 interface, ESW1 to ESWn Enable switch, F1 circular frame, L1 first approximate straight line, L2 second approximate straight line, R1 to Rn, Rx, Ry resistor, SW1 to SWn switch, T1, T2 input terminal, T3 output terminal, V1, V2 voltage, Vr1 to Vrn reference voltage, W1, W2 waveform

The invention claimed is:

1. A sensor amplifier circuit configured to amplify an output signal from a magnetic sensor circuit, the sensor amplifier circuit comprising:

a first operational amplifier configured to amplify an output signal from the magnetic sensor circuit; and a correction circuit configured to correct a nonlinear distortion contained in the output signal, wherein the magnetic sensor circuit is configured to:

output, in a first magnetic field region having a first range, a first signal with a magnitude corresponding to the magnetic field in the first range and output, in a second magnetic field region having a second range larger than the first range, a second signal with a magnitude corresponding to the magnetic field in the second range, wherein the correction circuit is configured to switch from a first state in which a nonlinear distortion contained in the output signal is not corrected to a second state in which a nonlinear distortion contained in the output signal is corrected, and wherein, when an output signal from the magnetic sensor circuit changes from the first signal to the second signal, the correction circuit is configured to switch from the first state to the second state.

2. The sensor amplifier circuit according to claim 1, wherein the first magnetic field region is provided by a magnetic field being applied to have the first range, and the second magnetic field region is provided by a magnetic field being applied to have the second range.

3. The sensor amplifier circuit according to claim 1, wherein the correction circuit is configured to automatically switch from the first state to the second state when the output signal from the magnetic sensor circuit changes from the first signal to the second signal.

4. The sensor amplifier circuit according to claim 1, wherein the correction circuit is configured to detect a change in the output signal from the magnetic sensor circuit from the first signal to the second signal based on an output signal from the first operational amplifier.

5. The sensor amplifier circuit according to claim 1, wherein the first operational amplifier is configured to amplify the output signal from the magnetic sensor circuit in accordance with a predetermined gain that is determined based on output characteristics of the magnetic sensor circuit in the first magnetic field region.

6. The sensor amplifier circuit according to claim 1, further comprising:

memory configured to store a setting value of the correction circuit; and a readout circuit configured to read the setting value stored in the memory and set the setting value in the correction circuit.

7. The sensor amplifier circuit according to claim 1, wherein the magnetic sensor circuit includes four sensor elements connected in a bridge configuration, and wherein the first operational amplifier is configured to amplify a differential voltage between a pair of output signals from the magnetic sensor circuit.

8. The sensor amplifier circuit according to claim 1, wherein the magnetic sensor circuit includes a magnetic sensor element.

9. The sensor amplifier circuit according to claim 8, wherein the magnetic sensor element is a Tunneling Magneto-Resistive (TMR) element.

10. The sensor amplifier circuit according to claim 1, further comprising:

a second operational amplifier, wherein an output terminal of the first operational amplifier is connected to an inverting input terminal of the second operational amplifier.

11. The sensor amplifier circuit according to claim 10, wherein the correction circuit includes:

a first negative feedback circuit and a second negative feedback circuit connected in parallel between an output terminal of the second operational amplifier and the inverting input terminal of the second operational amplifier; and a first comparator and a second comparator.

12. The sensor amplifier circuit according to claim 11, wherein the first negative feedback circuit includes a first resistor, and a first switch configured to open and close the first negative feedback circuit, and wherein the second negative feedback circuit includes a second resistor, and a second switch configured to open and close the second negative feedback circuit.

13. The sensor amplifier circuit according to claim 12, wherein:

the first comparator is configured to close the first switch when an output voltage of the first operational amplifier reaches a first reference voltage, and the second comparator is configured to close the second switch when an output voltage of the first operational amplifier reaches a second reference voltage larger than the first reference voltage.

14. The sensor amplifier circuit according to claim 10, further comprising a resistor that is configured to determine a reference amplification factor of the first operational amplifier and that is connected between the inverting input terminal of the second operational amplifier and the output terminal of the first operational amplifier.

15. A sensor system comprising the magnetic sensor circuit and the sensor amplifier circuit according to claim 1.

16. The sensor system according to claim 15, wherein the correction circuit is configured to automatically switch from the first state to the second state when the output signal from the magnetic sensor circuit changes from the first signal to the second signal.

17. The sensor system according to claim 15, wherein the correction circuit is configured to detect a change in the output signal from the magnetic sensor circuit from the first signal to the second signal based on an output signal from the first operational amplifier.

18. The sensor system according to claim 15, wherein the first operational amplifier is configured to amplify the output signal from the magnetic sensor circuit in accordance with a predetermined gain that is determined based on output characteristics of the magnetic sensor circuit in the first magnetic field region.

19. The sensor system according to claim 15, wherein the magnetic sensor circuit includes a magnetic sensor element that is a Tunneling Magneto-Resistive (TMR) element.

20. A method of calibrating the sensor amplifier circuit comprising:

measuring an output voltage of a magnetic sensor circuit with respect to a magnetic field;

calculating, by using measurement results obtained by the measuring, a first relational equation expressing a relationship between the magnetic field and an output voltage of the magnetic sensor circuit as a linear function;

determining, based on the first relational equation and the measurement results, a maximum linearity error;

determining, by using the maximum linearity error, a boundary between a first range of a first magnetic field region and a second range of a second magnetic field region;

calculating, based on the measurement results, a second relational equation expressing a relationship between the magnetic field and the output voltage of the magnetic sensor circuit as a linear function; and determining, by using the second relational equation, a gain and an offset of a first operational amplifier.

* * * * *